United States Patent
Mayya Kolake et al.

(10) Patent No.: US 7,659,624 B2
(45) Date of Patent: Feb. 9, 2010

(54) SEMICONDUCTOR DEVICE HAVING A NANOSCALE CONDUCTIVE STRUCTURE

(75) Inventors: Subramanya Mayya Kolake, Suwon-si (KR); Sun-Woo Lee, Icheon-gwangyeoksi (KR); In-Seok Yeo, Seoul (KR)

(73) Assignee: Samsung Electronics Co,., Ltd., Suwon-si, Gyeonggi-do (KR)

( * ) Notice: Subject to any disclaimer, the term of this patent is extended or adjusted under 35 U.S.C. 154(b) by 123 days.

(21) Appl. No.: 11/785,164

(22) Filed: Apr. 16, 2007

(65) Prior Publication Data
US 2008/0157363 A1    Jul. 3, 2008

(30) Foreign Application Priority Data
Apr. 25, 2006    (KR)    ...................... 10-2006-0037315

(51) Int. Cl.
H01L 23/48    (2006.01)
B05D 5/12    (2006.01)
H01L 29/76    (2006.01)
H01L 29/94    (2006.01)
H01L 31/00    (2006.01)

(52) U.S. Cl. .......... 257/741; 257/E23.01; 257/E23.145; 257/E21.586; 257/773; 257/774; 257/758; 257/288; 427/58

(58) Field of Classification Search .................. 257/741, 257/758, 773, 774, E23.145, E21.586, 288; 427/58
See application file for complete search history.

(56) References Cited

U.S. PATENT DOCUMENTS

| 6,062,931 | A | 5/2000 | Chuang et al. | |
|---|---|---|---|---|
| 2002/0167375 | A1* | 11/2002 | Hoppe et al. | 333/186 |
| 2003/0179559 | A1 | 9/2003 | Engelhardt et al. | |
| 2004/0009115 | A1 | 1/2004 | Wee et al. | |
| 2004/0108804 | A1* | 6/2004 | Hsu | 313/495 |
| 2006/0278901 | A1* | 12/2006 | Dangelo et al. | 257/276 |
| 2007/0247048 | A1* | 10/2007 | Zhang et al. | 313/311 |
| 2007/0284631 | A1* | 12/2007 | Hsu et al. | 257/288 |
| 2008/0237858 | A1* | 10/2008 | Nihei | 257/746 |
| 2008/0296537 | A1* | 12/2008 | Gordon et al. | 252/506 |
| 2008/0311818 | A1* | 12/2008 | Kim et al. | 445/50 |
| 2009/0027036 | A1* | 1/2009 | Nuckolls et al. | 324/76.11 |

FOREIGN PATENT DOCUMENTS

| JP | 2005-075666 | 3/2005 |
|---|---|---|
| JP | 2005-081519 | 3/2005 |
| KR | 10-2000-0033455 A | 6/2000 |
| KR | 10-2001-0058663 A | 7/2001 |
| KR | 10-2002-0041664 A | 6/2002 |

\* cited by examiner

*Primary Examiner*—Alexander O Williams
(74) *Attorney, Agent, or Firm*—Lee & Morse, P.C.

(57) ABSTRACT

A semiconductor device includes a substrate, an insulating layer having an opening, the opening exposing a portion of the substrate, a hydrophobic layer covering substantially only a sidewall and a top surface of the insulating layer, and a nanoscale conductive structure on the exposed portion of the substrate.

26 Claims, 5 Drawing Sheets

SEMICONDUCTOR DEVICE HAVING A NANOSCALE CONDUCTIVE STRUCTURE

BACKGROUND OF THE INVENTION

1. Field of the Invention

Embodiments of the present invention relate to a method of forming a nanoscale conductive structure and a semiconductor device formed thereby. More particularly, embodiments of the present invention related to a method of forming a nanoscale structure using a catalyst.

2. Description of the Related Art

Nanoscale conductive structures such as a carbon nanotube, a silicon nanowire, etc., may exhibit excellent electrical, thermal, and strength characteristics, and, accordingly, may be suitable for use in various electronic devices. In order to implement such nanoscale conductive structures, it may be necessary to selectively form the nanoscale conductive structure only on a desired region. However, such a selective formation may be complex, and may require a number of processes to be performed. Accordingly, there is a need for a simplified way to form nanoscale conductive structures.

SUMMARY OF THE INVENTION

The present invention is therefore directed to a method of forming a nanoscale conductive structure and a semiconductor device formed thereby, which substantially overcome one or more of the problems due to the limitations and disadvantages of the related art.

It is therefore a feature of an embodiment of the present invention to provide a method of selectively forming a catalyst in an opening on a substrate.

It is therefore another feature of an embodiment of the present invention to provide a method of selectively forming a catalyst in an opening in a layer that includes modifying a surface property of the layer.

It is therefore another feature of an embodiment of the present invention to provide a semiconductor device including a nanoscale conductive structure selectively in an opening on a substrate.

At least one of the above and other features and advantages of the present invention may be realized by providing a method of forming a nanoscale structure, including providing a substrate having a first layer thereon, the first layer having an opening that exposes a region of the substrate, and contacting the substrate with a catalytic material, wherein the exposed region of the substrate has a first property that attracts the catalytic material, and the first layer has a second property that repels the catalytic material.

The method may further include, before contacting the substrate with the catalytic material, treating the first layer so as to impart the second property to the first layer. Treating the first layer may include forming a hydrophobic protection layer on the first layer. Forming the hydrophobic protection layer may include contacting a surface modifier with the first layer such that a functional group of the surface modifier bonds to the first layer. The functional group of the surface modifier may include one or more of $NH_2$, COOH, $CONH_2$, SH, $SiCl_3$, $SiOC_2H_5$, or $SiOCH_3$. The first layer may be an oxide layer.

The catalytic material may include a hydrophilic solvent having particles of a catalyst therein. The catalytic material may include a hydrophilic solvent having a catalytic precursor therein. The catalytic precursor may be an organic metal precursor. The method may further include, after contacting the substrate with the catalytic material, thermally treating the substrate so as to convert the catalytic precursor to a catalyst.

The exposed region of the substrate may be hydrophilic, the first layer may be hydrophobic, and the catalytic material may be hydrophilic. The catalytic material may include a hydrophilic solvent having particles of a catalyst therein. The hydrophilic solvent may be water. The hydrophilic solvent may be a polymeric compound. The polymeric compound may include one or more of polyvinyl alcohol, a pyrrolidone-based polymer, or a copolymer of polymethylmethacrylate and polystyrene.

The exposed region of the substrate may be electrically conductive, and the first layer may be an insulating layer. The method may further include, after contacting the substrate with the catalytic material, growing the nanoscale structure from the exposed region of the substrate, wherein the nanoscale structure may be a conductive structure. The nanoscale structure may be a carbon nanotube. The method may further include, after contacting the substrate with the catalytic material, growing the nanoscale structure from the exposed region of the substrate, wherein the nanoscale structure may be a carbon nanotube. The method may further include, after contacting the substrate with the catalytic material, growing the nanoscale structure from the exposed region of the substrate, and forming an interconnection electrically connected to the nanoscale structure.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
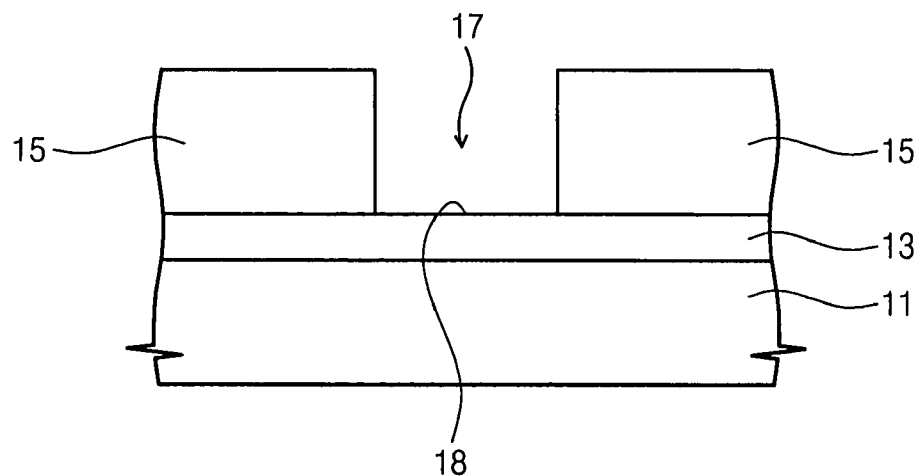
FIGS. 1 through 5 illustrate cross-sectional views of stages in a method of forming a carbon nanotube according to an embodiment of the present invention.

Korean Patent Application No. 2006-37315, filed Apr. 25, 2006, in the Korean Intellectual Property Office, and entitled: "Method of Selectively Forming Catalyst for Nanoscale Conductive Structure and Method of Forming the Nanoscale Conductive Structure," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include a fourth member, whereas the expression "at least one selected from the group consisting of A, B, and C" does not.

As used herein, the expression "or" is not an "exclusive or" unless it is used in conjunction with the phrase "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Exemplary embodiments of the present invention relate to nanotechnology and, in particular, to a method of forming a nanoscale conductive structure such as a nanotube, a nanowire or the like. As described herein, embodiments of the present invention may be employed to form nanoscale conductive structures. An embodiment of the present invention will now be described using a carbon nanotube as an exemplary nanoscale conductive structure. In particular, in a first exemplary embodiment, a method of selectively forming a carbon nanotube on a predetermined region of a substrate using a catalyst will be described. In a second exemplary embodiment, a method of forming upper and lower interconnections electrically connected using a carbon nanotube as a multi-level interconnection will be described. However, it will be appreciated that embodiments of the present invention are not limited thereto.

Among the various nanotechnologies, carbon nanotube technology has been extensively studied. Carbon nanotubes may be formed in various structures such as a single wall structure, a multiwall structure, a bundle structure, etc. In addition, the carbon nanotube may exhibit a specific quantum effect, because the carbon nanotube may have a conductive or semiconductive property according to a winding shape, different energy gaps according to a diameter thereof, and a quasi-one-dimensional structure. By virtue of the unique structural and physical properties of carbon nanotubes, they may be advantageously applied to form components of devices such as a flat panel displays device (FPDs), field emission display device (FEDs), secondary batteries and supercapacitors, hydrogen storage materials, chemical sensors, high strength/ultra-light composites, electrostatic discharge (ESD) composites, electromagnetic shielding (EMS) materials, etc.

FIGS. 1 through 5 illustrate cross-sectional views of stages in a method of forming a carbon nanotube according to an embodiment of the present invention. Referring to FIG. 1, a first conductive layer 13 may be formed on a substrate 11. The substrate 11 may include, e.g., a structure based on an arbitrary semiconductor, a ceramic substrate, an alumina substrate, a sapphire substrate, a silica substrate, a glass substrate, etc. The substrate 11 may include silicon, silicon-on-insulator (SOI), silicon-on-sapphire (SOS), silicon-germanium, doped or undoped silicon, one or more epitaxial layers formed by epitaxial growth techniques, other semiconductor structures, etc. In addition, the substrate 11 may include one or more layers formed thereon, e.g., a conductive layer, an insulating layer, etc.

The first conductive layer 13 may be, e.g., metal wiring formed on the substrate 11, a thin film coating a surface of the substrate 11, etc. The first conductive layer 13 may include, e.g., one or more of titanium nitride (TiN), gold, silver, palladium, copper, aluminum, tungsten, tantalum, titanium, molybdenum, cobalt, nickel, platinum, manganese, metal alloys, metal nitrides such as tantalum nitride (TaN) or tungsten nitride (WN), metal oxides such as indium-tin-oxide (ITO), aluminum oxide ($Al_2O_3$), titanium oxide ($TiO_2$), or magnesium oxide (MgO), metal sulfides, metal borides, etc.

An insulating layer 15 may be formed on the first conductive layer 13. The insulating layer 15 may have an opening 17 that exposes a predetermined region 18 (hereinafter, referred to as a catalyst forming region 18) of the first conductive layer 13. The insulating layer 15 may be, e.g., an oxide layer, and may include, e.g., silicon oxide, silicon nitride, silicon oxynitride, etc.

Figure 2:
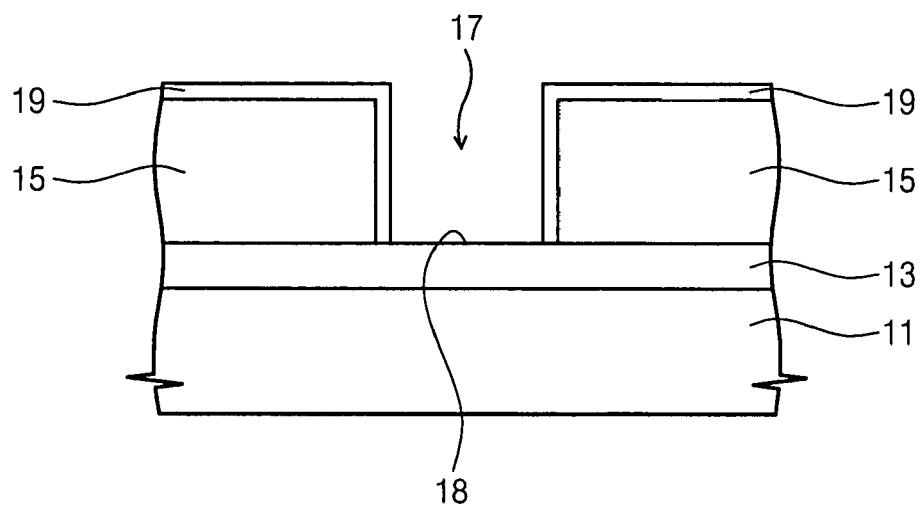

Referring to FIG. 2, a surface of the insulating layer 15 may be modified so that a catalyst, which may be used to grow carbon nanotubes, may be selectively formed on the catalyst forming region 18. The modification of the surface of the insulating layer 15 may prevent the formation of the catalyst on the modified surface. In an implementation, the surface modification of the insulating layer 15 may include making the surface of the insulating layer 15 hydrophobic. For example, a hydrophobic protection layer 19 covering the surface of the insulating layer 15 may be formed by contacting a surface modifier with the substrate 11. The hydrophobic protection layer 19 may be formed by, e.g., spin-coating, spraying, or dropping the surface modifier on the substrate 11 on which the insulating layer 15 is formed, by dipping the substrate 11 on which the insulating layer 15 is formed into the surface modifier, etc.

The surface modifier may include a functional group such as —$NH_2$, —COOH, —$CONH_2$, —SH, —$SiCl_3$, —$SiOC_2H_5$, —$SiOCH_3$, etc. Representative examples, i.e., non-limiting examples, of such functional groups include the following, which may be used alone or in combination. As the surface modifier having the functional group of $NH_2$, octadecylamine, dodecylamine, etc. As the surface modifier having the functional group of COOH, stearic acid, octanoic acid, etc. As the surface modifier having the functional group of SH, octadecanethiol, dodecanethiol, etc. As the surface modifier having the functional group of $SiCl_3$, octadecyltrichlorosilane (OTS), etc. As the surface modifier having the functional group of $SiOC_2H_5$, methoxysilane, polysiloxane, etc. As the surface modifier having the functional group of $SiOCH_3$, ethoxysilane, polysiloxane, etc.

As a particular example, the substrate 11 on which the insulating layer 15 is formed may be dipped into a surface modifier including OTS for about an hour at a temperature in range of about 70° C. to about 80° C., which may produce a hydrophobic protection layer 19 of a self-assembled monolayer of the OTS formed only on the surface of the insulating layer 15.

A proposed mechanism for the interaction of the surface modifier with a silicon oxide insulating layer 15 will now be described. However, it will be appreciated that embodiments of the present invention are not limited to any particular mechanism. During contact of the surface modifier with the silicon oxide insulating layer 15, the hydrophobic protection layer 19 may be formed through bonding of the functional group of the surface modifier to oxygen of a silanol (Si—O—H) of the insulating layer 15, e.g., by Van der Waals bonding or covalent bonding. For example, in case of the OTS having the functional group of $SiCl_3$, chlorine (Cl) of the $SiCl_3$ group may be eliminated in the form of HCl through combination with hydrogen (H) of a silanol hydroxyl group (—OH) in the insulating layer 15, and silicon (Si) of the $SiCl_3$ group may bond to oxygen (O) of the hydroxyl group to form the hydrophobic protection layer 19 having a —Si—O—Si— bond.

The surface modifier may be used pure (neat), may be dissolved in a suitable solvent, etc. The solvent for the surface modifier may include, e.g., toluene, alcohol, tetrahydrofuran, petroleum ether, acetonitrile, etc.

In an implementation, after forming the hydrophobic protection layer 19, the substrate 11 may be cleaned using, e.g., toluene, alcohol, tetrahydrofuran, petroleum ether, acetonitrile, etc., in order to remove any unreacted surface modifier that may remain on the catalyst forming region 18.

Figure 3:
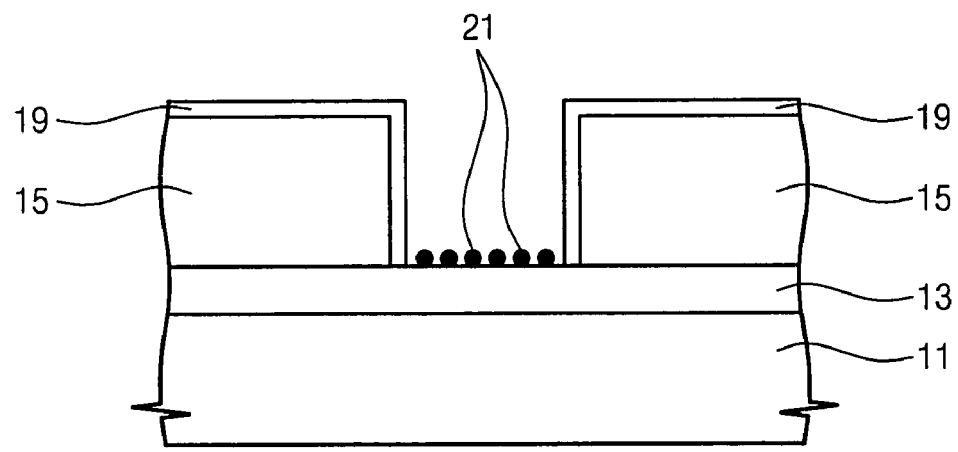

Referring to FIG. 3, catalyst nanoparticles 21 may be selectively formed on the catalyst forming region 18. Where the surface of the insulating layer 15 has been made hydrophobic by means of the hydrophobic protection layer 19, the catalyst nanoparticles 21 may be dispersed in a hydrophilic solution so as not to be wetted on the hydrophobic protection layer 19. In another implementation (not shown), where the surface of the insulating layer has been made hydrophilic by means of a hydrophilic protection layer, the catalyst nanoparticles may be dispersed in a hydrophobic solution so as not to be wetted on the hydrophilic protection layer. The catalyst nanoparticles 21 may not be formed on the surface of the insulating layer 15, but rather may be selectively formed on the catalyst forming region 18 at the bottom of the opening 17 though self-assembly, i.e., due to the affinity of the solution containing the catalyst nanoparticles 21 for the catalyst forming region 18.

The catalyst nanoparticles 21 may include one or more materials suitable for accelerating the growth of carbon nanotubes. For example, metal nanoparticles or metal oxide nanoparticles may be dispersed as a hydrophilic solution in a solvent such as water or polymer. The polymer may include, e.g., polyvinyl alcohol, a pyrrolidone-based polymer, a copolymer of polymethylmethacrylate and polystyrene, etc. The hydrophilic solution in which the nanoparticles are dispersed may be contacted with the substrate 11 by a predetermined technique, thereby forming the catalyst nanoparticles 21. The contacting of the hydrophilic solution, in which the nanoparticles are dispersed, with the substrate 11 may be performed using, e.g., spin-coating, spraying, dropping the hydrophilic solution with the nanoparticles dispersed therein on the substrate 11 having the hydrophobic protection layer 19, dipping the substrate 11 into the hydrophilic solution in which the nanoparticles are dispersed, etc.

The metal nanoparticles for the catalyst nanoparticles 21 may include, e.g., iron, cobalt, nickel, chromium, vanadium, platinum, palladium, etc. The metal oxide nanoparticles may include, e.g., oxides of these metals. Such catalyst nanoparticles may be formed by techniques that are well-known in the art, and the details thereof will not be repeated here.

Figure 4:
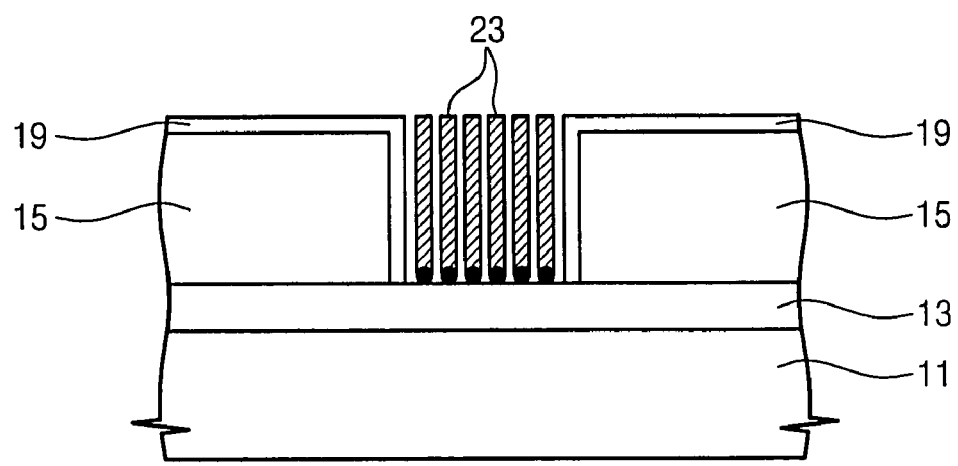

Referring to FIG. 4, carbon nanotubes 23 may be grown from the catalyst nanoparticles 21 using techniques that are well-known in the art. For example, the carbon nanotubes 23 may be grown from the catalyst nanoparticles 21 using a chemical vapor deposition (CVD) process and using a carbon source such as a hydrocarbon, carbon monoxide, carbon dioxide, etc. The hydrocarbon used as the carbon source may be, e.g., methane, ethane, acetylene, etc. In addition, hydrogen gas and/or an inert gas may be used with the carbon source.

Figure 5:
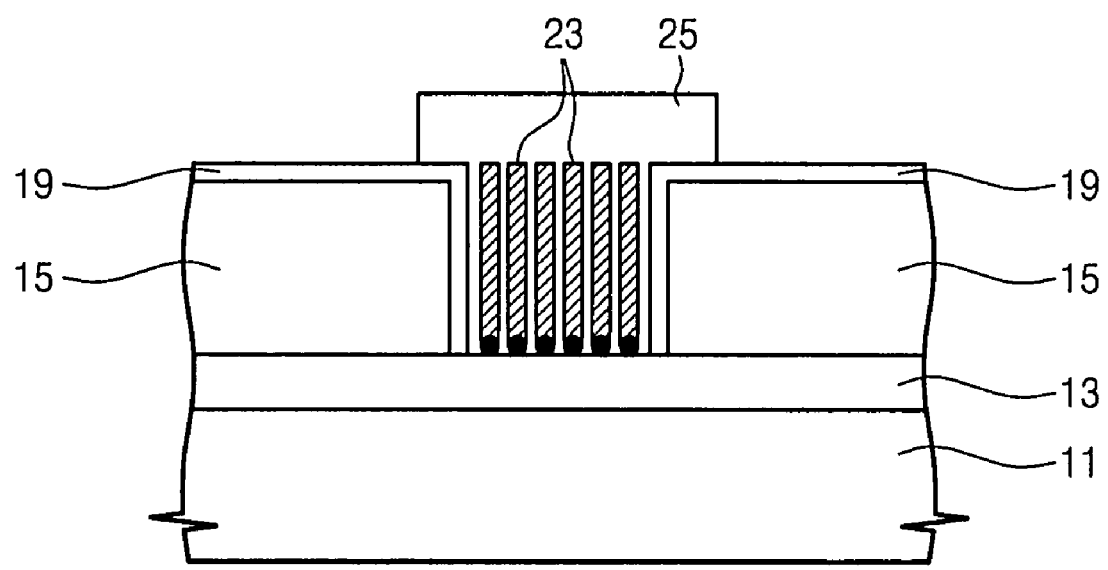

Referring to FIG. 5, a second conductive layer 25 may be formed such that it is electrically connected to the carbon nanotubes 23. The second conductive layer 25 may include, e.g., palladium, aluminum, titanium, tantalum, titanium nitride, combinations thereof, etc. In an implementation, the second conductive layer 25 may be formed of the same conductive material used for forming the first conductive layer 13.

In the method described above in connection with FIGS. 1 through 5, instead of using the hydrophilic solution in which preformed catalyst nanoparticles 21 are dispersed, a hydrophilic solution in which catalyst nanoparticle precursors such as organic metal precursors are dispersed may be used. For example, after contacting the hydrophilic solution in which the catalyst nanoparticle precursors are dispersed with the substrate 11 having the hydrophobic protection layer 19, a thermal treatment process may be performed to convert the catalyst nanoparticle precursors into the catalyst nanoparticles 21. The thermal treatment may include, e.g., heating for about three minutes to about one hour at about 400° C. to about 600° C. The catalyst nanoparticle precursors may include, e.g., iron pentacarbonyl, iron acetate, iron acetylacetonate, iron chloride, etc. As a solvent for the catalyst nanoparticle precursor, water, polymer, etc., may be used. The polymer may include, e.g., polyvinyl alcohol, a pyrrolidone-based polymer, a copolymer of polymethylmethacrylate and polystyrene, etc.

Figure 6A:
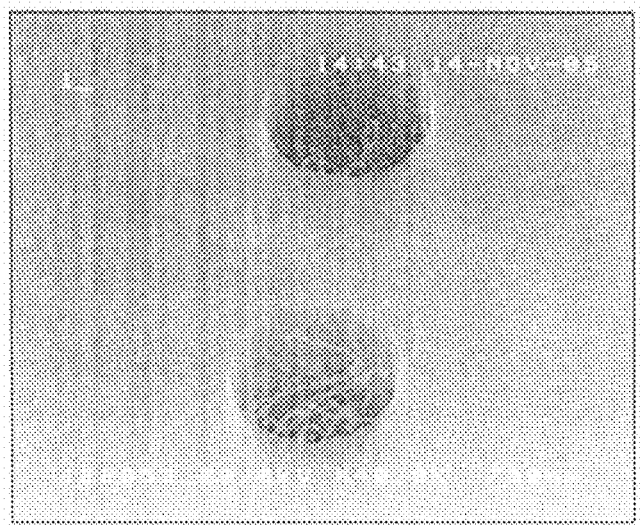
FIGS. 6A through 7B illustrate SEM micrographs of carbon nanotubes formed according to an embodiment of the present invention.
Figure 6B:
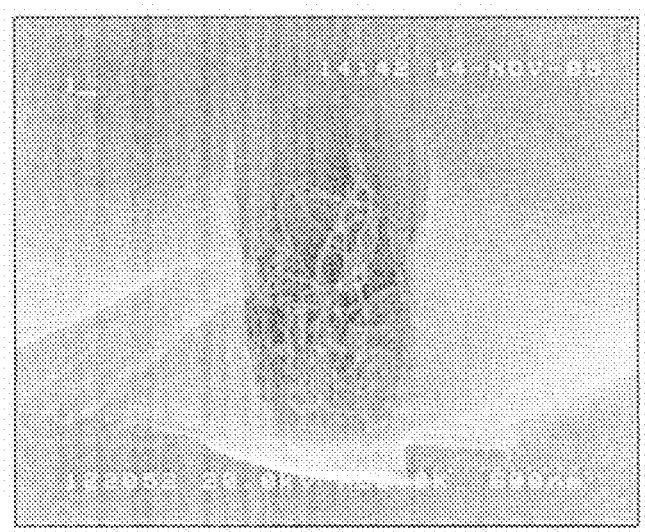
Figure 7A:
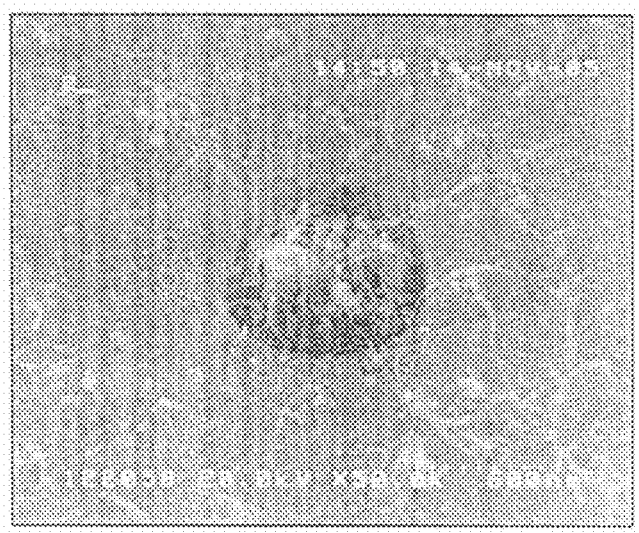
Figure 7B:

FIGS. 6A through 7B illustrate SEM micrographs of carbon nanotubes formed according to an embodiment of the present invention. Referring to FIGS. 6A and 6B, it can be seen that the carbon nanotubes are selectively formed in the predetermined region of the substrate defined by the opening.

In an implementation, the method of selectively forming the nanoscale conductive structure according to an embodiment of the present invention may be applied to an insulating substrate such as ceramic, alumina, sapphire, silica, quartz, etc., or to a semiconductor substrate such as silicon, silicon-germanium, germanium, etc. The method of selectively forming a nanoscale conductive structure according to an embodiment of the present invention may be employed to selectively form carbon nanotubes of, e.g., a field emission display device. For example, an array of openings may be formed in an insulating layer and carbon nanotubes may be selectively formed in the openings to provide a carbon nanotube array, of which each element of the array may provide field emission for a unit pixel of a flat panel display device.

As described above, an embodiment of the present invention may provide a simple method whereby a nanoscale conductive structure may be selectively formed on a predetermined region of the substrate. In addition, since carbon nanotubes may be grown from catalyst nanoparticles that are selectively formed in an opening of an insulating layer, it may be possible to precisely control the growth of the carbon nanotubes. Further, it may be possible to precisely control the size and shape of the carbon nanotubes, and thus form carbon nanotubes having desirable characteristics.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a substrate;
   an insulating layer having an opening, the opening exposing a portion of the substrate;
   a hydrophobic layer substantially only on a sidewall and a top surface of the insulating layer; and
   a nanoscale conductive structure on the exposed portion of the substrate.

2. The semiconductor device as claim in claim 1, wherein the exposed portion of the substrate comprises silicon, germanium, silicon-germanium, titanium nitride (TiN), gold, silver, palladium, copper, aluminum, tungsten, tantalum, titanium, molybdenum, cobalt, nickel, platinum, manganese, metal alloys, metal nitrides, metal oxides, metal sulfides, or metal borides.

3. The semiconductor device as claimed in claim 2, wherein the nanoscale conductive structure comprises a catalyst on the exposed portion of the substrate and a carbon nanotube grown on the catalyst.

4. The semiconductor device as claimed in claim 3, wherein the catalyst comprises metal nanoparticle or metal oxide nanoparticle.

5. The semiconductor device as claimed in claim 1, wherein the hydrophobic layer is formed by contacting a surface modifier with the insulating layer such that a functional group of the surface modifier bonds to the insulating layer.

6. The semiconductor device as claimed in claim 5, wherein the functional group of the surface modifier includes one or more of $NH_2$, $COOH$, $CONH_2$, $SH$, $SiCl_3$, $SiOC_2H_5$, or $SiOCH_3$.

7. The semiconductor device as claimed in claim 1, wherein the nanoscale conductive structure comprises a catalyst on the exposed portion of the substrate and a carbon nanotube grown on the catalyst.

8. A method of forming a semiconductor device, the method comprising:
   forming a first layer on a substrate, the first layer being an insulating layer having an opening exposing a portion of the substrate;
   forming a hydrophobic layer substantially only on a sidewall and a top surface of the insulating layer; and
   forming a nanoscale conductive structure on the exposed portion of the substrate.

9. The method as claimed in claim 8, further comprising:
   contacting the substrate with a catalytic material, wherein:
   the exposed region of the substrate has a first property that attracts the catalytic material, and
   the first layer has a second property that repels the catalytic material.

10. The method as claimed in claim 9, further comprising, before contacting the substrate with the catalytic material, treating the first layer so as to impart the second property to the first layer.

11. The method as claimed in claim 10, wherein treating the first layer includes forming a hydrophobic protection layer on the first layer.

12. The method as claimed in claim 11, wherein forming the hydrophobic protection layer includes contacting a surface modifier with the first layer such that a functional group of the surface modifier bonds to the first layer.

13. The method as claimed in claim 12, wherein the functional group of the surface modifier includes one or more of $NH_2$, $COOH$, $CONH_2$, $SH$, $SiCl_3$, $SiOC_2H_5$, or $SiOCH_3$.

14. The method as claimed in claim 12, wherein the first layer comprises an oxide layer.

15. The method as claimed in claim 11, wherein the catalytic material includes a hydrophilic solvent having particles of a catalyst therein.

16. The method as claimed in claim 11, wherein the catalytic material includes a hydrophilic solvent having a catalytic precursor therein.

17. The method as claimed in claim 16, wherein the catalytic precursor comprises an organic metal precursor.

18. The method as claimed in claim 9, wherein:
   the exposed region of the substrate is hydrophilic,
   the first layer is hydrophobic, and
   the catalytic material is hydrophilic.

19. The method as claimed in claim 18, wherein the catalytic material includes a hydrophilic solvent having particles of a catalyst therein.

20. The method as claimed in claim 19, wherein the hydrophilic solvent comprises water.

21. The method as claimed in claim 19, wherein the hydrophilic solvent comprises a polymeric compound.

22. The method as claimed in claim 21, wherein the polymeric compound includes one or more of polyvinyl alcohol, a pyrrolidone-based polymer, or a copolymer of polymethylmethacrylate and polystyrene.

23. The method as claimed in claim 1, wherein:
   the exposed region of the substrate is electrically conductive.

24. The method as claimed in claim 23, further comprising, after contacting the substrate with the catalytic material, growing the nanoscale structure from the exposed region of the substrate, wherein the nanoscale structure is a conductive structure.

25. The method as claimed in claim 24, wherein the nanoscale structure comprises a carbon nanotube.

26. The method as claimed in claim 9, further comprising, after contacting the substrate with the catalytic material, growing the nanoscale structure from the exposed region of the substrate; and
   forming an interconnection electrically connected to the nanoscale structure.

* * * * *